(12) United States Patent
Kawasaki et al.

(10) Patent No.: US 7,521,675 B2
(45) Date of Patent: Apr. 21, 2009

(54) CHARGED PARTICLE BEAM APPARATUS

(75) Inventors: Takeshi Kawasaki, Musashino (JP);
Tomonori Nakano, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/335,518

(22) Filed: Jan. 20, 2006

(65) Prior Publication Data

US 2006/0175548 A1 Aug. 10, 2006

(30) Foreign Application Priority Data

Feb. 4, 2005 (JP) ............................. 2005-028372

(51) Int. Cl.
*G01N 23/00* (2006.01)

(52) U.S. Cl. ..................... 250/310; 250/306; 250/307

(58) Field of Classification Search ............. 250/396 R, 250/396 ML, 436, 296 R, 306–443.1; 315/111.81
See application file for complete search history.

(56) References Cited

U.S. PATENT DOCUMENTS

| | | | | |
|---|---|---|---|---|
| 3,784,815 A | * | 1/1974 | Coates et al. ............... | 250/307 |
| 4,663,525 A | * | 5/1987 | Ohtsuki et al. ............. | 250/307 |
| 4,814,716 A | * | 3/1989 | Kato et al. ............. | 315/111.81 |
| 4,962,313 A | * | 10/1990 | Rose ......................... | 250/311 |
| 5,079,428 A | * | 1/1992 | Da Lin et al. ......... | 250/396 ML |
| 6,552,340 B1 | | 4/2003 | Krivanek et al. | |
| 6,667,476 B2 | * | 12/2003 | Todokoro et al. ........... | 250/310 |
| 6,723,997 B2 | * | 4/2004 | Matsuya et al. ......... | 250/396 R |
| 6,770,887 B2 | * | 8/2004 | Krivanek et al. ........ | 250/396 R |
| 6,852,983 B2 | * | 2/2005 | Matsuya et al. ....... | 250/396 ML |
| 6,924,488 B2 | * | 8/2005 | Matsuya et al. ......... | 250/396 R |
| 2002/0088940 A1 | * | 7/2002 | Watanabe et al. ............ | 250/310 |
| 2003/0127604 A1 | * | 7/2003 | Todokoro et al. ........... | 250/436 |
| 2006/0097197 A1 | * | 5/2006 | Sakaguchi ............. | 250/492.21 |

FOREIGN PATENT DOCUMENTS

JP 2001-351561 12/2001

OTHER PUBLICATIONS

J. Zach, et al.; Aberration Correction in a Low Voltage SEM by a Multipole Corrector; Journal; 1995; 316-325; Nuclear Instruments and Methods in Physics Research.
M. Haider, et al.; Correction of the Spherical Aberration of a 200 kV TEM by Means of a Hexapole-Corrector; Journal; 1995; 167-179; Optik.
O.L Krivanek, et al.; Towards sub-A Electron Beams; Journal; 1999; 1-11; Ultramicroscopy 78; Elsevier Science B.V.

* cited by examiner

*Primary Examiner*—Jack I Berman
*Assistant Examiner*—Andrew Smyth
(74) *Attorney, Agent, or Firm*—Antonelli, Terry, Stout & Kraus, LLP.

(57) ABSTRACT

A charged particle beam apparatus having an aberration correction capability at high acceleration voltages. The charged particle beam apparatus comprises a charged particle beam source; an extraction electrode to extract charged particles from the charged particle beam source; a charged particle beam gun including a means for converging a charged particle beam; an acceleration means for accelerating a charged particle beam emitted from the charged particle beam gun; and an aberration correction means disposed between the charged particle beam gun and the acceleration means, in which an aberration enough to cancel out an aberration of a charged particle beam on the specimen surface is provided to an extraction electrical potential or an equivalent beam at the initial acceleration stage.

10 Claims, 7 Drawing Sheets

CHARGED PARTICLE BEAM APPARATUS

CLAIM OF PRIORITY

The present application claims priority from Japanese application JP 2005-028372 filed on Feb. 4, 2005, the content of which is hereby incorporated by reference into this application.

FIELD OF THE INVENTION

The present invention relates to a charged particle apparatus, and more specifically to a scanning electron microscope, scanning transmission electron microscope, electron beam semiconductor inspection apparatus, electron beam semiconductor measurement apparatus, converging ion beam apparatus, and the like, all of which scan a specimen by converging a charged particle beam on the specimen.

BACKGROUND OF THE INVENTION

Since a scanning electron microscope (SEM), which scans the surface of a specimen with a narrowly focused electron beam, detects generated secondary electrons with a secondary electron detector, and displays a detected signal as a change in luminance on a TV monitor, allows observation of an object surface at a higher resolution than with an optical microscope, it is widely used for the measurement of the length and/or observation of foreign materials for the semiconductor wafer pattern that has been further microminiaturized in recent years, as well as for academic research. For the inspection of a semiconductor, the recent demand is for a high resolution of a few nanometers at which a material to be inspected can be observed at acceleration voltages of 1 kV or less, without damaging the material. The resolution of SEMs depends on how narrowly the electron beam can be focused on the specimen. The parameters affecting the diameter of an electron beam include, for example, magnitude of an electron source, variations in the energy of an incident electron beam, convergent angle, chromatic aberration of an objective lens, spherical aberration, and diffraction aberration. Conventionally, higher resolutions have been achieved by ingenuities in the electron optical system, particularly, lowering the reduction rate by increasing the reduction rate of an electron source and combining acceleration electric field and deceleration electric field to optimize the shape of the objective lens. However, it is becoming difficult to increase the resolution of SEMs only by optimizing the lens system.

There is an aberration corrector as a device to eliminate the chromatic aberration and spherical aberration. A basic configuration of this device is described in a paper of Zach (J. Zach and M. Haider, Nuclear Instruments and Methods in Physics Research A363 (1995) pp. 316-325), and other configurations are in the papers of Haider (M. Haider, G. Braunshausen, and E. Schwan, Optik 99 (1995) pp. 167-179), Krivanek (O. L. Krivanek, N. Dellby, A. R. Lupini, Ultramicroscopy 78 (1999) pp. 1-11), and others. The aberration corrector of Zach has functions to correct spherical aberration and chromatic aberration, and comprises four stages of electrostatic quadrupole element, magnetic quadrupole element, and electrostatic octupole element disposed along and about the optical axis. By varying the ratio of intensity of excitation to the electrostatic quadrupole element and magnetic quadrupole element, and electrostatic quadrupole element and magnetic quadrupole element, the trajectory of an electron beam passing on the optical axis can be varied in the x-direction or y-direction independently.

The aberration corrector described in the paper of Haider et al. (M. Haider, G. Braunshausen, and E. Schwan, Optik 99 (1995) pp. 167-179) is a corrector to correct the spherical aberration of the objective lens of a transmission electron microscope (TEM), and comprises a combination of two magnetic field 6-polar elements and two sets of doublet lenses.

The aberration corrector described in the paper of Krivanek at el. (O. L. Krivanek, N. Dellby, A. R. Lupini, Ultramicroscopy 78 (1999) pp. 1-11) is a corrector to correct the spherical aberration of a scanning transmission electron microscope (STEM), and comprises a combination of four magnetic quadrupole elements and three magnetic octupole elements. This spherical aberration corrector for STEM can be considered basically Zach's quadrupole-octupole type aberration corrector in which all of quadrupole and octupole elements are magnetic type.

U.S. Pat. No. 6,552,340 discloses a charged particle-based apparatus provided with an automated aberration correcting function.

In addition, JP-A 351561/2001 discloses an invention that employs an aberration corrector in the ion beam irradiation system of an FIB processing apparatus. Since the ion beam has larger mass and higher energy than the electron beam, according to the invention disclosed in JP-A No. 351561/2001, the aberration correction is achieved by decelerating an ion beam generated in the ion source after accelerating it, and providing an aberration corrector in the deceleration space.

SUMMARY OF THE INVENTION

The prior arts and inventions described in the above documents are hardly practical.

The aberration correction method (J. Zach and M. Haider, Nuclear Instruments and Methods in Physics Research A363 (1995) pp. 316-325) allows both of spherical aberration and chromatic aberration theoretically, but is not practical in the case of the aberration correction for electron beams with a large acceleration energy. That is, in the Zach's method, when acceleration energy is increased, it is necessary to extend the aberration corrector in proportional to the acceleration voltage, narrow the bore radius of a quadrupole element in proportion to a square root of the acceleration voltage, or increase the electrode voltage of quadrupole elements in proportion to the acceleration voltage, thus making this method impractical in terms of the manufacturing cost taking into consideration the upper limit of supply voltages, withstand voltage of multipolar elements, and fabrication, or the design dimension of the SEM. An SEM with chromatic aberration at an acceleration voltage of 8 keV is described in J. Zach and M. Haider, Nuclear Instruments and Methods in Physics Research A363 (1995) pp. 316-325, but the maximum acceleration voltage of a standard general-purpose SEM is generally about 30 kV. If acceleration voltage becomes around 10 kV or greater in the Zach's method, it may be effectively difficult to manufacture the SEM.

In the Krivanek's methods (U.S. Pat. No. 6,552,340 and O. L. Krivanek, N. Dellby, A. R. Lupini, Ultramicroscopy 78 (1999) pp. 1-11), the chromatic aberration corrector composed only of magnetic field multi-polar elements are used in order to accommodate high energy. However, these methods allow the correction of spherical aberration, but total chromatic aberration will increase.

Therefore, an object of the present invention is to realize a charged particle optical system, a charged particle gun, and a charged particle beam-based apparatus, all of which allow aberration correction.

The above problems with prior arts can be solved by performing an aberration correction at a stage before a charged particle beam generated in the charged particle beam source is highly accelerated, i.e., at an initial stage where the energy of the charged particle beam is relatively low. An example of initial acceleration stage is a stage where the potential of a charged particle beam is equal to or almost equal to that of the extraction electrode (extraction potential). When a charged particle beam is accelerated at several stages after providing the extraction potential, the aberration correction may be performed at initial few stages.

DETAILED DESCRIPTION OF THE PREFERRED EMBODIMENTS

First Embodiment

Figure 1:
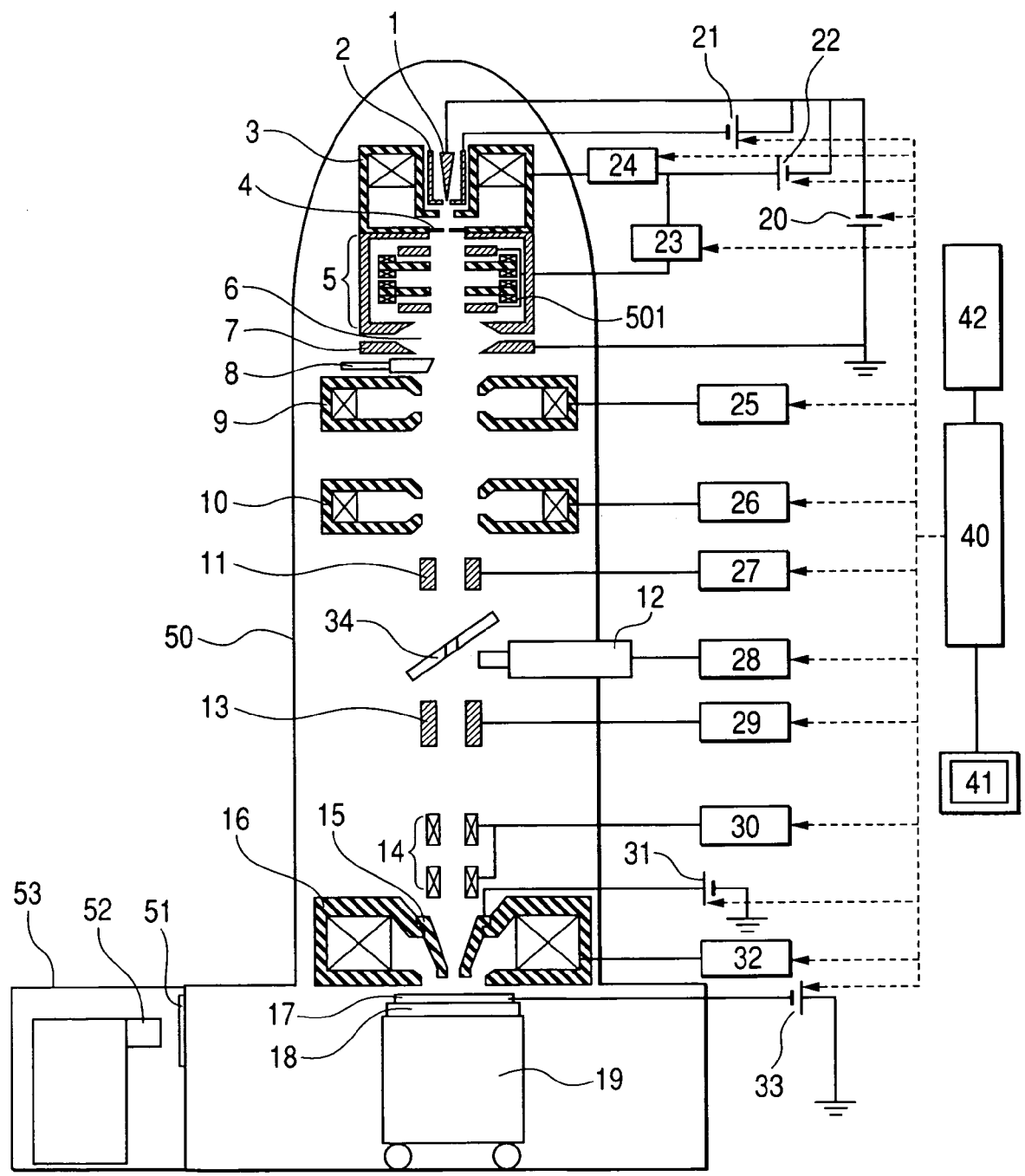
FIG. 1 shows a configuration of a charged particle beam-based apparatus according to a first embodiment.

Preferred embodiments of a scanning electron microscope are described below with reference to the drawings. FIG. 1 shows an entire configuration of a scanning electron microscope. A Schottky electron source 1 is an electron source that utilizes the Schottky effect by spreading oxygen and zirconium in a single crystal of tungsten, and near the Schottky electron source is provided a suppressor electrode 2. A magnetic lens 3 is disposed in the vicinity of this electron source. The upper magnetic pole of this magnetic lens 3 doubles as an extraction electrode.

The magnetic lens 3 is unnecessary in principle, but it is better to provide this lens for adjustment of virtual source position (object point with respect to an aberration corrector 5). Without the effect of the magnetic lens 3, the virtual source position as seen from the aberration corrector 5 side of an extracted beam from the Schottky electron source 1 at extraction voltage $V_1$ would be several centimeter above the electron source. If the virtual source position is fixed with respect to the aberration corrector 5, it is impossible to adjustment the aberration correction conditions in response to changes in the focal point of a condenser lens/objective lens, changes in acceleration voltage, and the like, and therefore it is advantageous to have a function of adjusting virtual source position for operational reasons.

Heating the Schottky electron source 1 up to approximately 1800K (a heating power supply is not shown), and applying a voltage $V_1$ of approximately +2 kV across the electron source and the magnetic lens 3 from an extraction power supply 22, causes Schottky electrons to be emitted. A suppressor negative voltage is applied to the suppressor electrode 2 to suppress electrons emitted from other than the tip of the Schottky electron source 1. Electrons reduced to a required amount by an aperture 4 disposed at the lower magnetic pole of the magnetic lens, are incident on the aberration corrector 5 that is mounted such that it is integral with the magnetic lens 3. The magnetic lens 3 and the aberration corrector 5 are joined with a coupling means such as screws (not shown). The magnetic lens 3 and the aberration corrector 5 may be formed integrally from the start, but it is better to manufacture them separately and then assemble them so that the assembly process of electron guns is facilitated.

The aberration corrector 5 performs an aberration correction on incident electrons. The operation of the aberration corrector according to this embodiment is described herewith reference to FIG. 7. The aberration corrector 5 comprises four stages of electrostatic quadrupole elements 91, 92, 93, 94; magnetic quadrupole elements 95, 96 that are almost analogous with the electrical potential distribution formed by the electrostatic quadrupole elements 92, 93 and form a magnetic potential distribution rotated by 45 degrees about optical axis; and electrostatic octupole elements 97, 98, 99, 100. In the figure, a number is given to each stage. This means that an electrical potential by the electrostatic quadrupole lens and an electrical potential by the electrostatic octupole element are overlapped at first and fourth stages. Similarly, electrical potentials by the electrostatic quadrupole lens and electrostatic octupole element and a magnetic potential by the magnetic quadrupole lens rotated by 45 degrees about optical axis. These electrical potential distribution and magnetic potential distribution can be formed by using four stages of twelve pole elements. If the twelve pole elements at second and third stages are formed with a metal with high-permeability, a magnetic potential distribution almost analogous with an electrical potential distribution can be formed.

Figure 7:
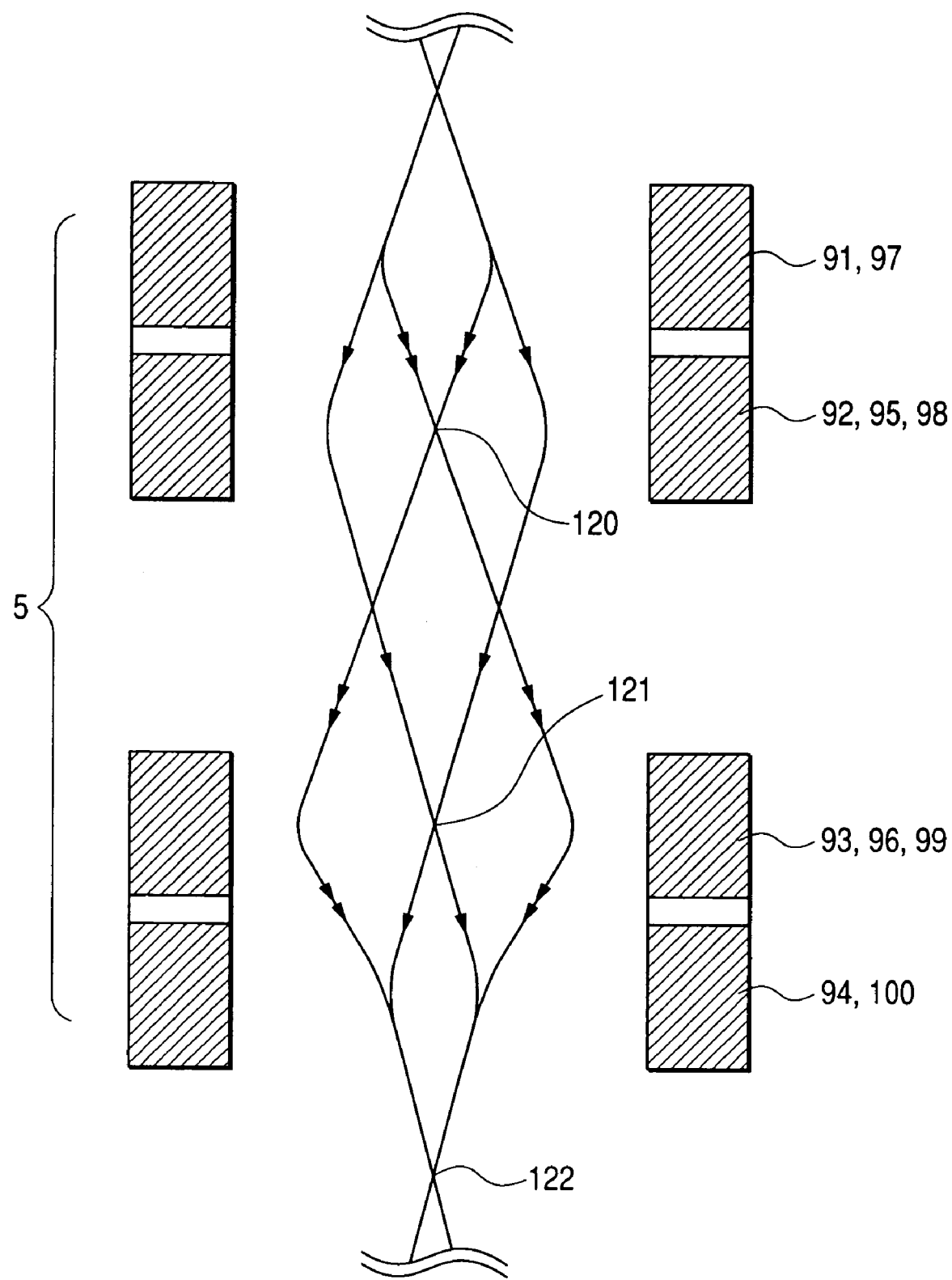
FIG. 7 is an operational diagram of an aberration corrector.

In the aberration corrector 5, due to the field of the quadrupole element, convergent and divergent actions are produced in each of the two directions (x axis and y axis) perpendicular to the optical axis (z axis) to separate the paraxial trajectory. In FIG. 7, the trajectory of a charged particle beam is schematically represented by the thin lines. The charged particle beam is diverged on the x direction trajectory (x trajectory, shown by a single arrow in the figure), and converged on the y direction trajectory (y trajectory, shown by a double arrow), by the electrostatic quadrupole element 91 at first stage of the aberration corrector 5, to separate. A trajectory in an arbitrary direction can be considered as a linear combination of these x and y trajectories. At second stage, a quadrupole electrical potential by the electrostatic quadrupole element 92 and a quadrupole magnetic potential rotated about the optical axis by 45 degrees in the x-y plane with respect to the quadrupole electrical potential by the magnetic quadrupole elements 95 are overlapped. The electrostatic quadrupole element 91 at first stage is excited such that the y trajectory crosses with the optical axis around the center of the electrostatic quadrupole element 92. At this time, the x trajectory is off-axis at a maximum, and a linear crossover 120 extending in the x direction is formed at around the center of the electrostatic quadrupole element 92.

The excitation of the electrostatic quadrupole element 92 and magnetic quadrupole element 95 is adjusted so that the x trajectory crosses the optical axis at around the center of the electrostatic quadrupole element 93 at third stage. The line crossover 121 at this time forms a line extending in the y direction. The x and y trajectories separated from each other through the electrostatic quadrupole element at fourth stage, meet at the crossover 122. At this time, in the aberration corrector 5, it is possible to excite the electrostatic quadrupole element 92 and magnetic quadrupole element 95 by changing the intensity ratio of electrostatic and magnetic quadrupole elements, under the condition of constraint that a resultant force exerted on an incident charged particle having a reference energy is not caused to change. Then, since a charged particle having an energy different from the reference is different from a charged particle with a reference energy in its velocity, a change in the intensity ratio of electrical field and magnetic field causes the exerted force to change, resulting in the trajectory being displaced.

This displacement is larger in the x direction that is away from the optical axis, but little affects the y direction extending towards the center of the quadrupole electrical potential. When the trajectory passes through the electrostatic quadrupole element 93, this relation between x and y is reversed. That is, by changing the ratio of energy intensity between the electrostatic quadrupole element 92 and magnetic quadrupole element 95 and the electrostatic quadrupole element 93 and magnetic quadrupole element 96, it is possible to change the trajectory of only a charged particle whose incident energy has been changed in the x and y directions independently. Taking advantage of this, in the aberration corrector 5 in advance, chromatic aberration is corrected by shifting outward the trajectory of a charged particle with higher energy and shifting inward the trajectory of a charged particle with lower energy, by the amount of correction of the chromatic aberration of the entire system including an objective lens. Spherical aberration is corrected by four stages of electrostatic octupole elements 97, 98, 99. 100. The electrostatic octupole element acts on a charged particle with a force varying with the third power of the off-axis distance, and corrects the spherical aberration (aperture aberration) in the x direction at second stage where a line crossover is formed, and in the y direction at third stage, and at first and fourth stages, corrects the spherical aberration (aperture aberration) in 45 degree direction.

The aberration corrector 5 is integral with the magnetic lens 3 and the magnetic lens forms a magnetic path with a metal having high permeability such as mu-metal, while the aberration corrector 5 has four stages of multi-polar element in its casing made of a non-magnetic metal, and overlaps four stages of quadrupole electrical potentials, four stages of octupole electrical potentials, a quadrupole magnetic potential each at second and third stages. Therefore, the multi-polar elements at second and third stages (for example, a quadrupole potential and an octupole potential are produced by a twelve pole element and overlapped) double as the magnetic pole and electrical pole, and are formed of a metal with high permeability.

A coil 501 for generating magnetic field to provide a magnetic field to a magnetic field polar element lens in the aberration corrector is displaced either within the casing of the aberration corrector 5 or outside of a vacuum chamber 50. When displaced within the casing of the aberration corrector 5, it is desirable to form the coil of a material with high-temperature (about 300° C.) resistance such as a ceramic-coated copper wire or the like. Since the operating atmosphere of the aberration corrector is ultrahigh vacuum, providing a cooling means for the coil around the aberration corrector will result in complicated configuration of the apparatus. Therefore, by forming the coil 501 of a material with high-temperature resistance, the apparatus can be simply constructed. This does not apply to a case where the coil is disposed outside the vacuum chamber.

In order to increase the magnetic field generation efficiency on the optical axis, an external magnetic path ring (not shown) insulated from the polar element is provided outside of each twelve pole element at second and third stages. A voltage is applied to each twelve pole element from a control power supply of the aberration corrector 23 via an insulating field-through provided within the casing of the aberration corrector 5, to feed a electric current to the coil 501. The control power supply of the aberration corrector 23 and the magnetic lens current supply are floated at a potential of an extraction power supply 22.

Now, the control method for the aberration corrector of this embodiment will be briefly described. First, the chromatic aberration and spherical aberration to be canceled out by the aberration corrector 5 can be expressed by the expressions:

$$\frac{Ccobj+(Mobj)^2 Cccond+(McondMobj)^2 Ccgun\text{-}corr}{(V_0/V_1)^{3/2}} \quad (3)$$

$$\frac{Csobj+(Mobj)^4 Cscond+(McondMobj)^4 Csgun\text{-}corr}{(V_0/V_1)^{3/2}} \quad (4)$$

where Ccgun-corr is a chromatic coefficient for the magnetic lens 3 and aberration corrector 5, Csgun-corr a spherical aberration coefficient, Cccond a chromatic aberration coefficient for the first and second condenser lens 9, 10, Csobj a spherical aberration coefficient, Mobj a magnification of the objective lens, $V_0$ an acceleration voltage, and $V_1$ an extraction voltage. The aberration corrector 5 adjusts the Ccgun-corr and Csgun-corr such that each of the above expressions (3) and (4) becomes zero.

This adjustment is made by the operator by calculating the initial values of an current and voltage to be applied, by the computer, to the multi-polar elements of the aberration corrector from the values of an extraction voltage, and observing the SEM image based on that settings. Since the aberration corrector 5 generates reverse aberrations of the Ccobj and Csobj, the correction effect increases as the Mcond or Mobj, and $V_0/V_1$ increase. However, it should be noted that larger magnification allows aberration correction but a small spot may not be obtained.

The bottom of the casing of the aberration corrector 5 is formed of electrode materials, and a Butler type electrostatic lens 6 is formed of a lower electrode of the Butler lens disposed opposite to the bottom of the casing (referred to as an upper electrode of the Butler lens, for convenience). The upper and lower electrodes of the Butler lens each has an aperture for passing an electron beam, and around the aperture is formed a taper so that the inner diameter of the aperture decreases from the center of the Butler lens towards the outside. At this time, mirror-finishing the tapered face will have an effect of preventing electric discharge.

The Butler type electrostatic lens is formed by applying voltage $V_0$ across upper and lower electrodes of the Butler type electrostatic lens from a high voltage power supply. Since the intensity of this lens can be controlled by the value of $V_0/V_1$, and determines the virtual source position, when the operator selects observation conditions (acceleration voltage, magnification, probe current, etc.) on an operation console, the computer 40 reads the values of $V_0$ and $V_1$, which have been determined based on simulations and/or experiments and stored in its memory, in an electro-optic system optimally satisfying the observation conditions, and outputs the values to the high voltage power supply 20 and the suppressor power supply 21. A valve 8 is disposed under the Butler type electrostatic lens 6, and maintained at ultra high vacuum above the valve in the vacuum chamber 50, to form an electron gun (a vacuum discharge system is not shown).

An electron accelerated by acceleration voltage $V_0$, when emitted from the electron gun, forms a crossover by a first condenser lens 9 between it and a second condenser lens 10, and also forms a crossover by second condenser lens 10 around a beam blanker 11, and is incident on the objective lens 16. An upper magnetic pole 15 is insulated from the objective lens 16, and can be incident on the objective lens 16 by further accelerating the electron with an acceleration electric field generated by a boosting voltage power supply 31. A negative voltage is applied to a specimen 17 from a retarding voltage power supply 33, and consequently a deceleration electric field is generated on the specimen, and the electron is decelerated to be incident on the specimen. The electron focused on the specimen surface is scanned by a scanning coil, and the generated secondary electrons are pulled upward of the specimen by retarding and boosting electric fields, deflected by an E×B beam deflector 13, is incident on a reflection plate 34, and produces tertiary electrons which are detected by a secondary electron detector.

By performing a luminance modulation with this detected signal in synchronous with the scanning, an image of the specimen surface is formed on a monitor 41. For a large disc-shaped specimen like a semiconductor wafer, the specimen 17 is fixed on a specimen stage 19 with an insulator sandwiched in between. To change a specimen, when a preparation chamber 53 is sufficiently evacuated with the specimen being inside it, a gate valve 51 is opened, and the specimen is carried to the specimen stage 19 by a specimen carrier 52. Thus, if the present invention is applied to the SEM, an electron with low energy before acceleration undergoes aberration correction at low voltages of multi-polar electrodes and then is accelerated, and therefore it is possible to obtain a beam that has undergone aberration correction at an acceleration voltage of, for example, 10 kV or more, and thereby to expand the application of the aberration corrector that was limited to low acceleration regions.

It is possible to apply the present invention to a semiconductor wafer appearance inspection apparatuses and wiring pattern measurement apparatuses, by adding various image analyzing apparatuses and signal analyzing means to the scanning electron microscope according to this embodiment.

Second Embodiment

Figure 2:
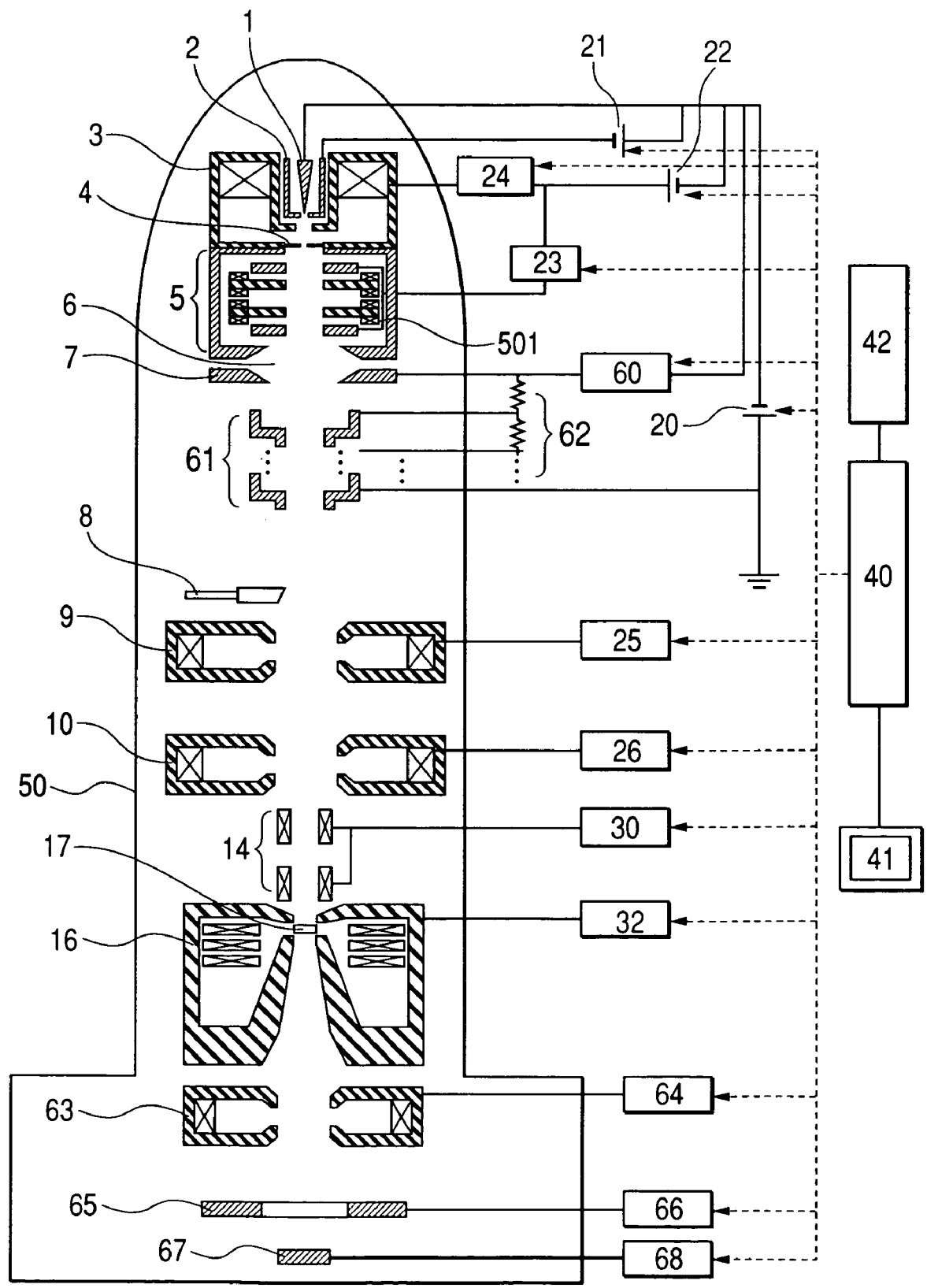
FIG. 2 shows a configuration of a scanning transmission electron microscope according to a second embodiment.

FIG. 2 shows an example application of the present invention to the scanning transmission electron microscope (STEM).

The electron gun section has the same configuration as in the first embodiment, in which an acceleration tube 61 is disposed under the Butler type electrostatic lens 6, and an electron is accelerated by a high voltage power supply 20. Under the acceleration tube 61 is provided a space called an electron gun chamber (not shown), where the electron gun section is evacuated up to ultra high vacuum by an ion pump or the like, to separate from the low vacuum side by means of the valve 8. The accelerated electron beam leaves the acceleration tube, is spread at an appropriate angle by the condenser lens 9 and 10, and then focused on the specimen 17 by the objective lens 16.

This focused beam is scanned on the specimen 17 by the scanning coil 14. The large angle spread beam of the beam that has been transmitted through the specimen and spread is detected by an annular detector 65, and then a dark field image is displayed on the monitor 41, by applying luminance modulation with this detected signal in synchronous with the scanning. The on-axis beam is detected by an axial detector 67 to form a bright field image. The main aberrations to be corrected are spherical aberration and chromatic aberration of the objective lens 16, and spherical aberration and chromatic aberration are corrected by making a correction equivalent to expression (4), on the beam that is not yet accelerated at a high voltage by the aberration corrector 5. The process of the correction can be monitored with a Ronchigram, and can be adjusted.

According to this embodiment, it is possible to realize a high-resolution STEM wherein the irradiation spot diameter is small, by correcting not only spherical aberration but also chromatic aberration with a compact electron gun.

Third Embodiment

Figure 3:
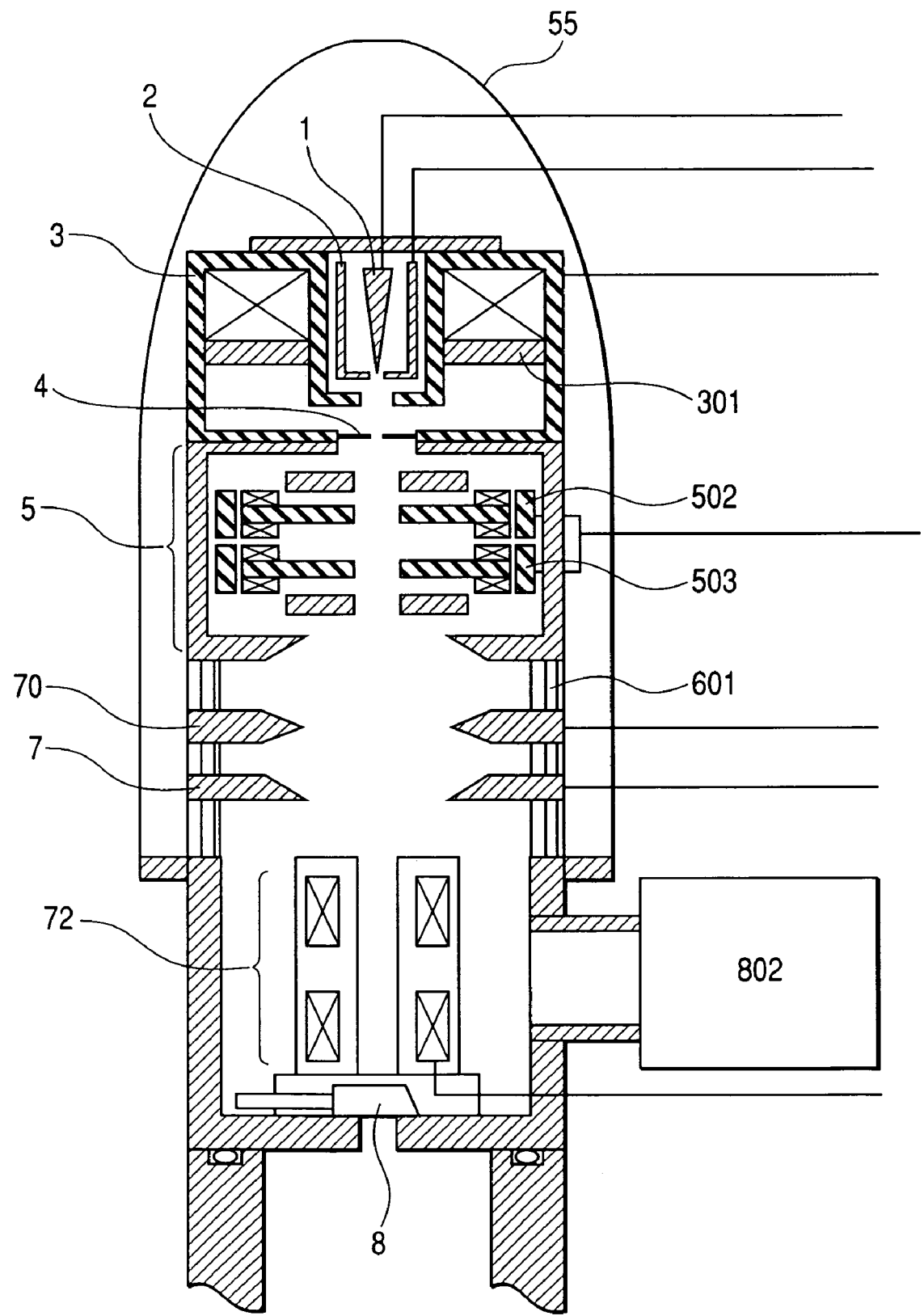
FIG. 3 illustrates a configuration of an electron gun according to a third embodiment.

For Third Embodiment, an example application to the electron gun is described. FIG. 3 shows an example configuration of an electron gun of this embodiment. In the electron gun of First Embodiment, if extraction voltage $V_1$ and acceleration voltage $V_1$ are determined, the intensity of the Butler type electrostatic lens 6 is determined. In order to provide more likelihood to electro-optic systems, even when the extraction voltage $V_1$ and acceleration voltage $V_0$ are determined, it is possible to control the intensity of the electrostatic lens, by inserting an electrode 70 to which a midpoint potential is given, on the lower electrode 7 of the Butler type electrostatic lens via an insulating tube 601 to form a 3-plate electrode configuration, as shown in FIG. 3. Particularly, $V_0$ can be used more widely on the deceleration side, making it possible to control the positions of the object point and image point by the magnetic lens 3 and midpoint potential $V_2$ respectively. Further, more accurate axis arraignment with a subsequent electro-optic system can be achieved by providing the gun beam deflector 72.

It is more preferable to couple the entire electron gun to the chamber thereunder via an O-ring by utilizing vacuum, and provide a mechanical axial arraignment mechanism capable of finely moving in the horizontal direction on the O-ring. Since a high voltage is exposed above the insulating tube 601 in this structure, an insulator housing 55 is covered that has an insulating material attached inside, and is made to be at ground potential outside. It is more effective to have such a structure that allows filling the insulation gas such as $SF_6$ within the housing 55. Thus, if the aberration corrector is incorporated in the electron gun, it is possible to incorporate an aberration correction function without changing the design of the chamber, by replacing the electron gun of an existing apparatus with an electron gun of the present invention.

Fourth Embodiment

Figure 4:
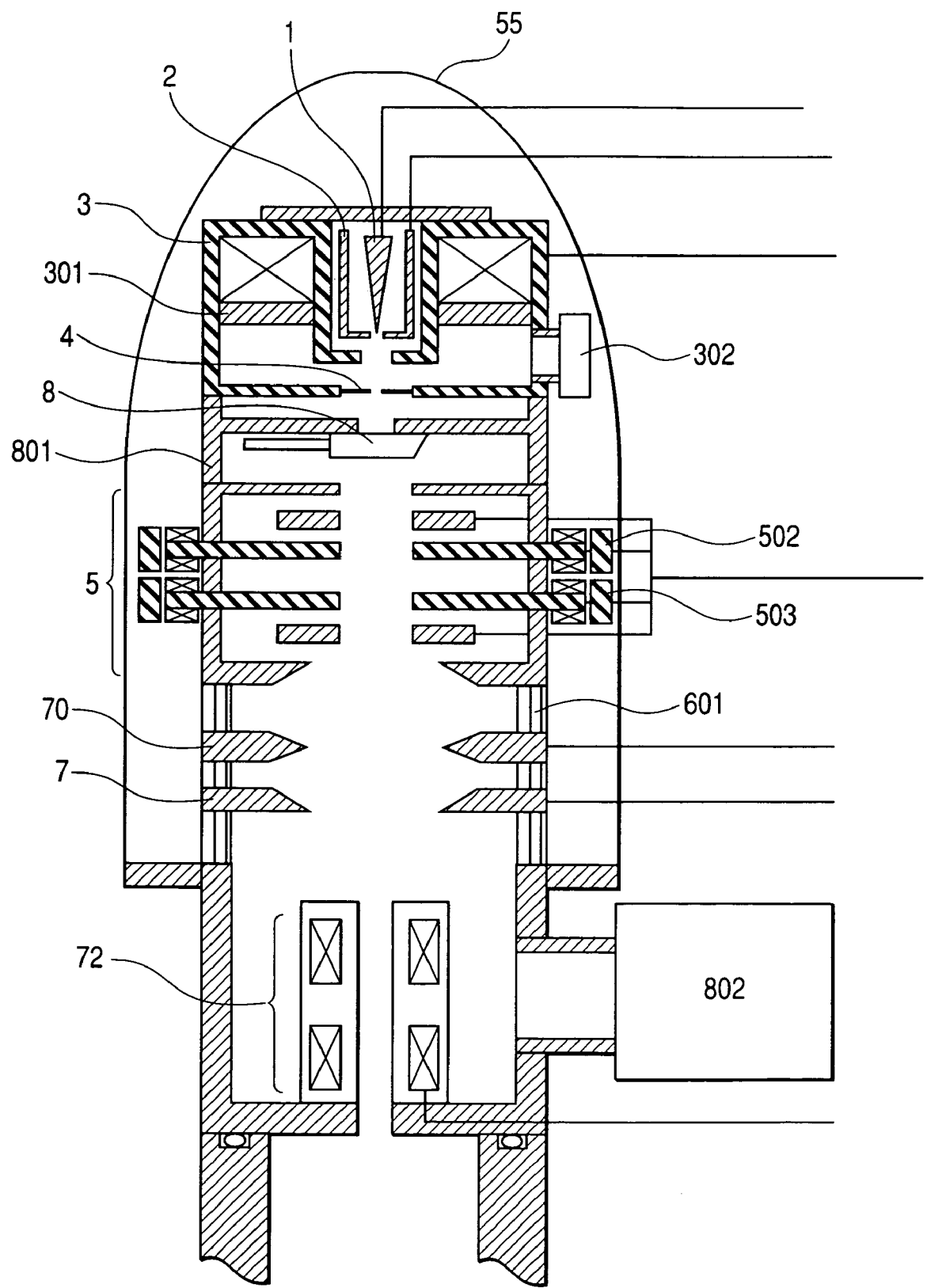
FIG. 4 illustrates a configuration of an electron gun according to a fourth embodiment.

FIG. 4 shows another embodiment of the electron gun according to the present invention.

In this embodiment, a chamber 801 is provided between the magnetic lens 3 and aberration corrector 5 so that a valve 8 can be attached. A compact ion pump is provided on the magnetic lens 3 side for ultra-high degree of evacuation. The coils for the magnetic quadrupole element at second and third stages of the aberration corrector 5 are disposed outside the vacuum. Mu-metal rings 502 and 503 form each magnetic pole and magnetic path at second and third stages respectively, but are electrically insulated from each magnetic pole. This structure has an advantage that the electron source can be replaced with a vacuum on the aberration corrector side being maintained.

Fifth Embodiment

Figure 5:
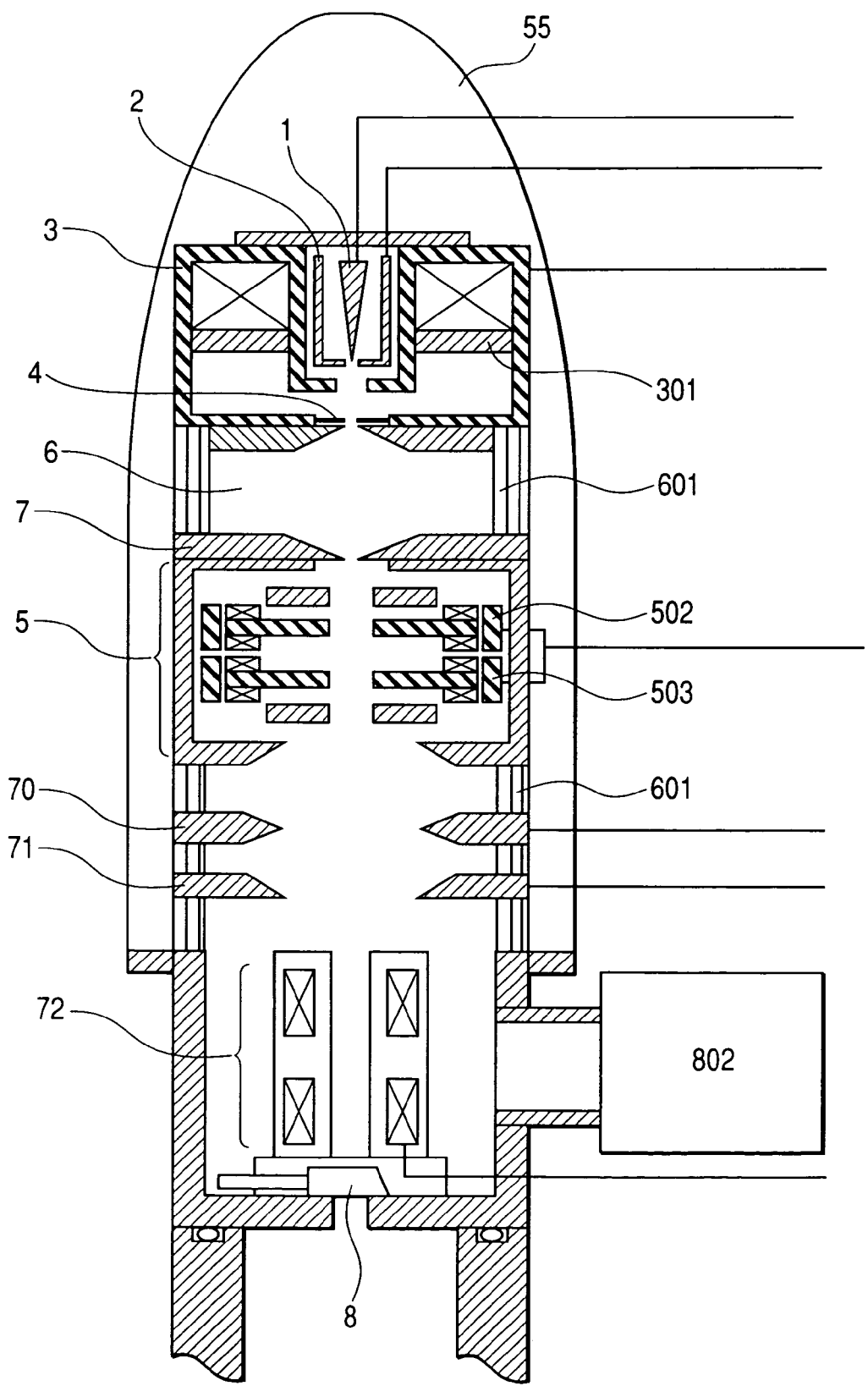
FIG. 5 shows a configuration of an electron gun according to a fifth embodiment.

FIG. 5 shows still another embodiment of an electron gun according to the present invention.

In this embodiment, the Butler type electrostatic lens 6 is disposed between the magnetic lens 3 and aberration corrector 5. By doing like this, it is possible to form a virtual source just above the Butler type electrostatic lens 6 with the magnetic lens 3, and thereby to provide more current. This allows suppressing the spherical aberration of the Butler type electrostatic lens 6, thus reducing the multi-polar element voltages and currents of the aberration corrector for aberration correction.

Sixth Embodiment

Figure 6:
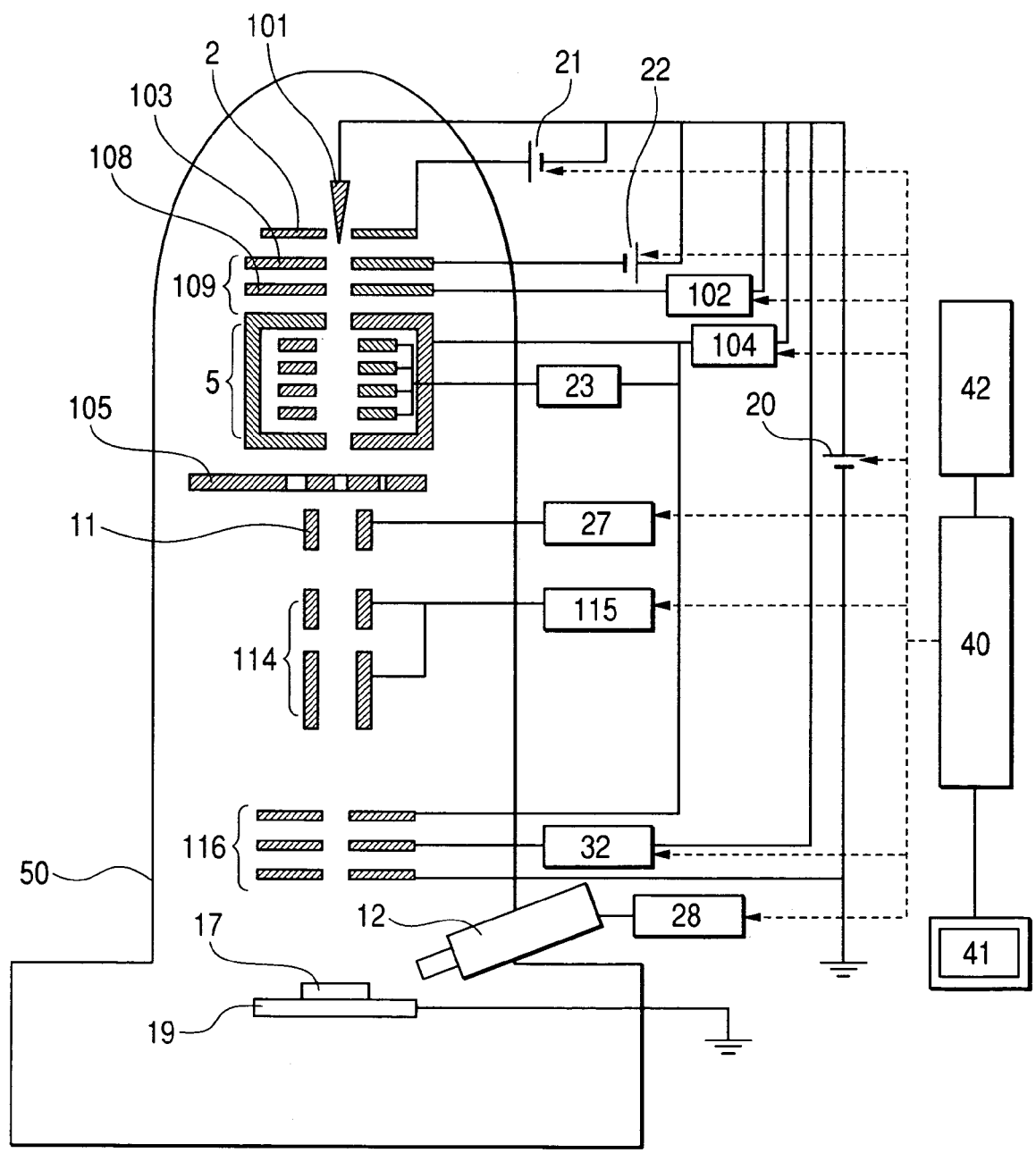
FIG. 6 shows a configuration of a convergent ion beam apparatus according to a sixth embodiment.

FIG. 6 shows an example of application of the present invention to the convergent ion beam apparatus (FIB).

This embodiment is to correct an increase in probe diameter due to spherical aberration on the high probe current side by means of an electrostatic quadrupole element and an electrostatic octupole element, to provide an FIB suitable for high-speed precision processing. When a negative voltage is applied across the ion source 101 and extraction electrode 103 from the extraction power supply, a positive ion is extracted into an electric field. The suppressor electrode is provided near the ion source 101, and ion discharge is suppressed by applying a positive voltage to the ion source 101. The condenser lens 109 is formed of the extraction electrode 103, the electrode 108, and the top of the casing of the aberration corrector 5. An ion beam is accelerated by the electrode 108 and a voltage is applied by the power supply 104, so that the voltage becomes almost the same as the extraction voltage in the aberration corrector 5, and thereby the condition is set such that an approximately parallel ion beam is incident on the aberration corrector 5.

Four stages of multi-polar elements are disposed in the aberration corrector 5, and overlaps each four stages of quadrupole electrical element potentials and octupole element electrical potentials. To these multi-polar elements are supplied voltages from the control power supply of the aberration corrector. This control voltage 23 operates by floating with an electrical potential provided from the power supply 104. The spherical aberration method is the same as described above. After exiting the aberration corrector 5, the amount of current to the ion beam is limited by the aperture 105 and the beam is focused on the specimen 17 by the objective lens 116. The beam is scanned on the specimen surface with the electrostatic deflector 114 and beam blanker 11. It is possible to input a predetermined scanning region shape to the computer 40 and perform a hole processing on the specimen in a desired shape. After the processing, secondary electrons generated by scanning a wide region with a low current beam are detected by the secondary electron detector 12 to observe the shape of the hole as an SIM (Scanning Ion Microscope) image.

In an FIB processing apparatus of this embodiment, there is no chromatic aberration due to magnetic field, and a chromatic aberration is caused by the aberration corrector 5, and as a result chromatic aberrations increase for the entire system. Accordingly, this is particularly effective in a high probe current range (probe current 20 nA or more) where the beam probe diameter is increasing mainly due to spherical aberration. Since it is possible to perform an aberration correction on the beam at an approximately extraction potential, and control the virtual source position of the aberration corrector 5 with the action of the condenser lens 109, it is possible to provide an aberration correction FIB apparatus at lower control power supply voltages and on a feasible scale.

The present invention may be used for scanning electron microscopes, semiconductor inspection apparatus, scanning transmission electron microscopes, convergent ion beam apparatus, and the like.

What is claimed is:

1. A charged particle beam apparatus which irradiates a specimen with a charged particle beam including:
    a charged particle gun which emits the charged particle beam; and
    a charged particle optical system which directs the emitted charged particle beam to the specimen;
    the charged particle gun further comprising:
    means for generating the charged particle beam;
    an aberration corrector which adds a reverse aberration correction to the charged particle beam so as to cancel an aberration caused in the charged particle optical system; and
    an acceleration means for accelerating the charged particle beam to which the reverse-aberration correction has been added,
    wherein the charged particle gun and the aberration corrector are integrally formed.

2. A charged particle beam apparatus according claim 1, wherein the aberration corrector enables correction of at least one of chromatic aberration and spherical aberration.

3. A charged particle beam apparatus according to claim 1, further comprising a valve disposed between the charged particle gun and the charged particle optical system so as to open and close an aperture for passing the charged particle beam; and a means for activating the valve.

4. A charged particle beam apparatus according to claim 1, wherein the acceleration means is a Butler type electrostatic lens.

5. A charged particle beam apparatus including a charged particle gun;
    the charged particle gun comprising:
    a charged particle beam source which generates a charged particle beam;
    an extractor electrode which extracts the charged particle beam to outside of the charged particle beam source;
    an aberration corrector which corrects aberration of the charged particle beam that has passed the extraction electrode; and
    a Bulter type electrostatic lens which accelerates the charged particle beam that passed the aberration corrector;
    wherein the Butler type electrostatic lens comprises an upper electrode formed on the bottom of the aberration corrector and a lower electrode disposed opposite to the upper electrode.

6. A charged particle beam apparatus according to claim 5, wherein the upper and lower electrodes of the Butler type electrostatic lens each is tapered along the perimeter of an aperture through which the charged particle beam passes.

7. A charged particle beam apparatus according to claim 1, wherein the aberration further comprises:
    four stages of electrostatic quadrupole elements; and
    two stages of magnetic quadrupole elements;
    wherein the two stages of magnetic quadrupole elements generate a magnetic potential distribution similar to a rotated electrical potential distribution of the electrostatic quadrupole elements by 45 degrees with respect to an optical axis of the charged particle beam.

8. A charged particle beam apparatus according to claim 7, wherein the aberration corrector further comprises four stages of electrostatic octupole elements that apply an octupole electrical potential to the four stages of electrostatic quadrupole element.

9. A charged particle beam apparatus according to claim 1, the aberration corrector further comprises:
    four stages of electrostatic quadrupole elements; and
    four stages of electrostatic octupole elements that applies an octupole electrical potential to the four stages of electrostatic quadrupole element.

10. A charged particle beam apparatus according to claim 6, wherein the tapered portion of the aperture is mirror-finished.

* * * * *